(12) United States Patent
Ng et al.

(10) Patent No.: US 7,948,224 B2
(45) Date of Patent: May 24, 2011

(54) FEEDBACK CONTROLLER HAVING MULTIPLE FEEDBACK PATHS

(75) Inventors: Chik Wai Ng, Hong Kong (CN); Yat To Wong, Hong Kong (CN); David Kwok Kuen Kwong, Davis, CA (US)

(73) Assignee: Hong Kong Applied Science and Technology Research Institute Co. Ltd., Hong Kong (HK)

( * ) Notice: Subject to any disclaimer, the term of this patent is extended or adjusted under 35 U.S.C. 154(b) by 409 days.

(21) Appl. No.: 11/731,167

(22) Filed: Mar. 30, 2007

(65) Prior Publication Data

US 2008/0238396 A1    Oct. 2, 2008

(51) Int. Cl.
  *G05F 1/00*    (2006.01)
(52) U.S. Cl. .................................... 323/284; 323/285
(58) Field of Classification Search .................. 323/284, 323/285
  See application file for complete search history.

(56) References Cited

U.S. PATENT DOCUMENTS

| | | | |
|---|---|---|---|
| 5,278,490 A | | 1/1994 | Smedley |
| 5,548,833 A | * | 8/1996 | Townsend .................. 455/234.1 |
| 5,747,977 A | * | 5/1998 | Hwang ........................ 323/284 |
| 5,777,462 A | * | 7/1998 | Yue ............................... 323/285 |
| 6,084,450 A | | 7/2000 | Smith et al. |
| 7,253,593 B1 | * | 8/2007 | Chen et al. .................... 323/283 |
| 2004/0227497 A1 | * | 11/2004 | Asanuma et al. ............. 323/283 |

OTHER PUBLICATIONS

"Signal Flow Graph in Loop Gain Analysis of DC-Dc PWM CCM Switching Converters"; Wing-Hung Ki; Jun. 1998; pp. 644-655.
"Topics in Multiple-Loop Regulators and Current-Mode Programming"; R.D. Middlebrook; 1985; pp. 716-732.

\* cited by examiner

*Primary Examiner* — Jared J. Fureman
*Assistant Examiner* — Jue Zhang
(74) *Attorney, Agent, or Firm* — Stuart T. Auvinen; gPatent LLC

(57) ABSTRACT

A feedback controller comprises first and second feedback circuits. The first feedback circuit is connected between an input node and an output node and has an error node. The first feedback circuit comprising a feedback amplifier for comparing a feedback signal to a reference signal and providing an error signal, and a comparator for comparing the error signal to a second reference signal and providing an output signal. The second feedback circuit is connected between the input node and the error node and comprises a current source coupled to the error node and a controller coupled to the input node for controlling the current source in response to a value of the feedback signal being above or below a threshold value.

18 Claims, 2 Drawing Sheets

- Large    - Small    Vref    + Small    +Large
 Offset     Offset             Offset     Offset

FEEDBACK CONTROLLER HAVING MULTIPLE FEEDBACK PATHS

BACKGROUND TO THE INVENTION

1. Field of the Invention

The current invention relates to a feedback controller having multiple feedback paths. Particularly, although or exclusively, the current invention also relates to a feedback controller having multiple feedback paths which can be used as a pulse width modulation control circuit for a switch mode power supply.

2. Background Information

Pulse width modulation control circuits are well known and are widely used in switch mode power supplies. A typical controller has a feedback path that compares a sample of the power supply output with a referenced voltage and generates an error signal for a PWM control circuit that varies the duty cycle of the power supply switching device in response to the value of the error signal. As with all control systems there is a trade-off of between stability and response time. Controllers having low bandwidth always provide very stable control characteristics, but react slowly to large changes in the output voltage of the power supply. Controllers having a high bandwidth react quickly to large changes in the output but can be difficult to stabilize especially in noisy environments or in power supply supplying quickly changing loads. Various control strategies and circuits are available which purport to solve these problems including voltage-mode control, current-mode control, one-cycle control, feed forward, feedback and V Square control systems. While all of these different methods having their own advantages and disadvantages which might suit particular applications there still remains a trade-off between stability and speed of response of the control circuit.

It is an object of the present invention to provide a feedback controller having multiple feedback paths that provides improved response to step load changes in voltage output of a power supply while still providing stable regulation under constant or slowly varying load conditions. It is a further object of the present invention to provide a feedback controller having multiple feedback paths which ameliorates at least some of the problems associated with known feedback controllers or which at least provides the public with a useful alternative.

SUMMARY OF THE INVENTION

Accordingly, there is disclosed herein a feedback controller comprising first and second feedback circuits. The first feedback circuit is connected between an input node and an output node and has an error node. The first feedback circuit comprising a feedback amplifier for comparing a feedback signal to a reference signal and providing an error signal, and a comparator for comparing the error signal to a second reference signal and providing an output signal. The second feedback circuit is connected between the input node and the error node and comprises a current source coupled to the error node and a controller coupled to the input node for controlling the current source in response to a value of the feedback signal being above or below a threshold value. The first feedback circuit provides a first feedback path and the second feedback circuit provides a second feedback path.

Preferably, the feedback amplifier is a low bandwidth and high gain differential amplifier and the first feedback circuit is a voltage-control or current-control circuit.

Preferably, the current source comprises a current sink.

Preferably, the controller comprises a comparator for comparing the value of the feedback signal to the threshold value, and a switch coupled to the comparator for turning the switch on and off in order to control the current source.

Preferably, the threshold value comprises an upper threshold value and a lower threshold value and the current source comprises a source current and a sink current and the controller is arranged to turn on the source current if the value of the feedback signal is above the upper threshold value and to turn on the sink current if the value of the feedback signal is below the lower threshold value.

Preferably, the controller comprises a first comparator for comparing the value of the feedback signal to the upper threshold value and turning on and off the source current, and a second comparator for comparing the value of the feedback signal to the lower threshold value and turning on and off the sink current.

Preferably, the feedback controller further comprises a switch coupled to the comparator for being turned on and off by the feedback controller. The switch may control the output voltage of a switch mode power supply.

There is also disclosed herein a pulse width modulation (PWM) control circuit for a switch mode power supply comprising a switching circuit, a low bandwidth feedback circuit and a high gain high bandwidth feedback circuit. The switching circuit has an error node and controls a duty-cycle of a switch in response to an error signal at an error node. The low bandwidth feedback circuit is connected to the switch mode power supply output for sensing a portion of an output signal of the switch mode power supply and generating a first error signal at the error node. The high gain high bandwidth feedback circuit is connected in parallel with the low bandwidth feedback circuit and to the switch mode power supply output for sensing the portion of the output signal of the switch mode power supply and generating a second error signal at the error node. The high gain high bandwidth feedback circuit compares the portion of the output signal to upper and lower threshold values and generates the second error signal only when the portion of the output signal is above the upper threshold value or below the lower threshold value.

Preferably, the high gain feedback circuit comprises a current source coupled to the error node and a controller coupled to the switch mode power supply output for controlling the current source in response to the portion of the output signal being above or below the threshold values.

Preferably, the current source comprises a current sink.

Preferably, the controller comprises a comparator for comparing the value of the portion of the output signal to the threshold values, and a switch coupled to the comparator for turning the switch on and off in order to control the current source.

Preferably, the current source comprises a source current and a sink current and the controller is arranged to turn on the source current if the value of the portion of the output signal is above the upper threshold value and to turn on the sink current if the value of the portion of the output signal is below the lower threshold value.

Preferably, the controller comprises a first comparator for comparing the value of the portion of the output signal to the upper threshold value and turning on and off the source current, and a second comparator for comparing the value of the portion of the output signal to the lower threshold value and turning on and off the sink current.

Further aspects of the invention will become apparent from the following description, which is given by way of example only.

BRIEF DESCRIPTION OF THE DRAWINGS

The invention will now be described with reference to the accompanying drawings in which.

DETAILED DESCRIPTION OF THE EXEMPLARY EMBODIMENTS

Figure 1:
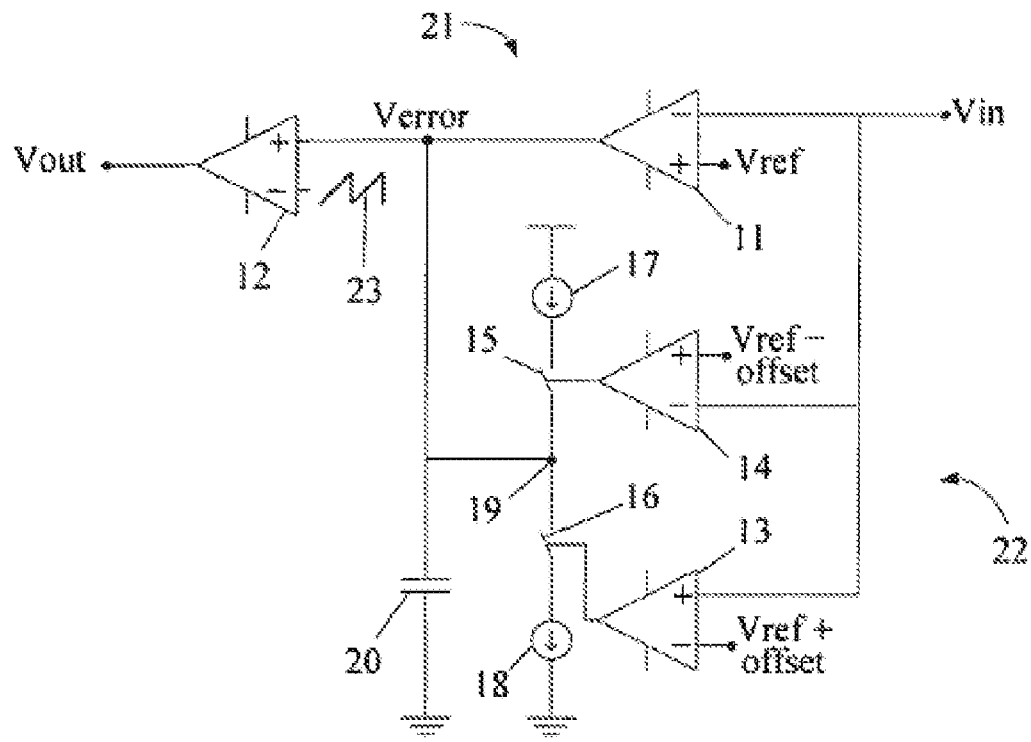
FIG. 1 is a schematic circuit diagram of a feedback controller according to the invention.
Figure 2:
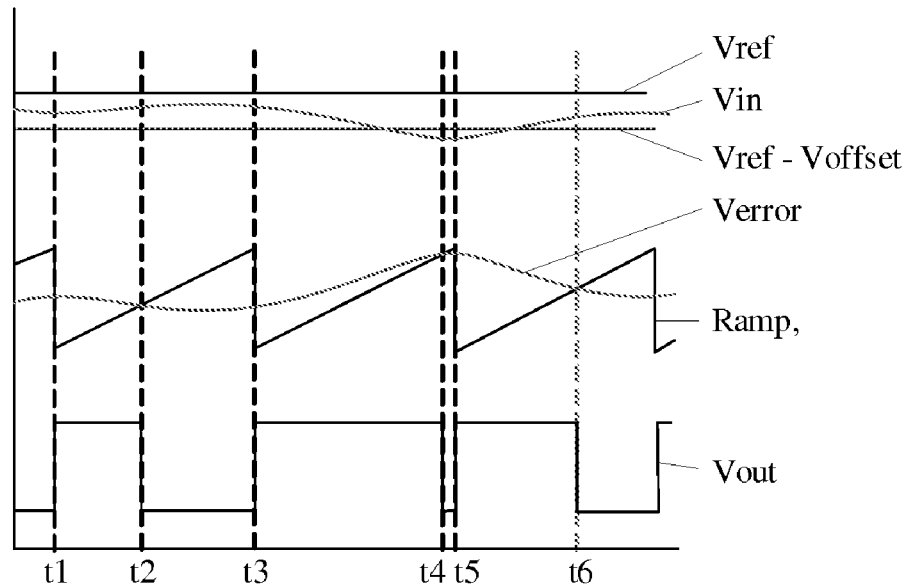
FIG. 2 is a schematic illustration of voltage signals of the circuit of FIG. 1.

FIG. 1 of the drawings shows a feedback controller 10 according to the invention which comprises an input node Vin an output node Vout and two feedback paths 21, 22. The first feedback path is connected between the input nodes Vin and output Vout and includes a low bandwidth and high gain differential amplifier 11 and a comparator 12 coupled together at an error node Verror. The differential amplifier 11 compares a feedback signal input at input node Vin with a reference voltage Vref. The output of the differential amplifier 11 is an error signal at the error node Verror. The comparator 12 compares the error signal with a periodic ramp, or sawtooth, reference signal 23. When the value of error signal is greater than the value of the ramp signal 23 the comparator output goes as high as possible and when the value of the error signal is less than the value of the ramp signal 23 the output of the comparator 12 goes as low as possible. The output of the comparator 12 is coupled to the output node Vout. Accordingly, when the value of the feedback signal at node Vin is equal to the value of the reference voltage Vref the error signal at node Verror will be constant steady-state error and the output voltage Vout will cycle ON and OFF at a constant duty cycle. When the value of the feedback signal at node Vin falls below reference voltage Vref the error voltage becomes positive and the output of the comparator and thus the voltage at Vout will switch between high and low states in accordance with the value of the error voltage and the periodic oscillations of the ramp 23 increasing the duty cycle of Vout. This is illustrated at t1, t2 and t3 of the graph of FIG. 2. It will be apparent to the skilled addressee that the relative value of error signal controls the duty cycle of the output voltage Vout and thus this feedback arrangement can be used to control a switch mode of power supply. It will also be appreciated by the skilled addressee the duty cycle of the output Vout, as with any period switching device, is the ratio of ON time to the total cycle time. This is expressed mathematically as:

$$D = \frac{t_{on}}{T}; \text{ where } D \text{ is the duty cycle and } T = t_{on} + t_{off}$$

The second feedback path 22 is connected between the input node Vin and the error node Verror. The second feedback path 22 comprises a pair of parallel comparators 13, 14. The outputs of the comparators 13, 14 provide switch control signals for two switches 15, 16 respectively. The switches 15, 16 connected in series with a source current generator 17 and a sink current generator 18. A common output node 19 of the source and sink current generators 17, 18 is coupled to a capacitor 20 and to the error node Verror. The first comparator 13 compares the feedback signal at input node Vin with an upper threshold reference signal Vref+Voffset. The second comparator 14 compares the feedback signal at input node Vin with a lower threshold reference signal Vref−Voffset. Thus, the second feedback path 22 is adapted to detect when the feedback signal at input node Vin moves outside a specific voltage range + or − Voffset of the reference voltage Vref. If the feedback signal at input node Vin is within the range Vref+/− Voffset the feedback controller operates on the first feedback path 21 only.

If, for example, the feedback signal at node Vin falls below the lower threshold Vref−Voffset the output of comparator 14 switches as high as possible and closes switch 15 turning on the sourcing current generator 17. The source current causes an increase in the error current Ierror flowing at error node Verror causing a corresponding increase in the error signal. The feedback path 22 dominates to control Verror instead of path 21 and the error signal remains above the level of the ramp so that the output of the comparator 12 remains as high as possible until the feedback signal at node Vin returns to within the threshold range Vref=/− Voffset. When the feedback signal at node Vin returns above the lower threshold Vref−Voffset the output of the comparator 14 again goes low opening switch 15 to turn the sourcing current 17 off and allowing the error signal Verror to return to control of the first feedback path 21. This is illustrated at times t4, t5 and t6 in FIG. 2. As will be appreciated by the skilled addressee, if the feedback signal goes above the upper threshold Vref+Voffset the comparator 13 output goes high turning on the sinking current generator 18. Current is pulling out of the error node Verror causing a reduction in Ierror and a corresponding reduction in the value of the error signal. The feedback path 22 is again dominates to control Verror instead of path 21 and the error signal remains below the level of the ramp so that the output of the comparator 12 remains as low as possible until the feedback signal at node Vin returns to within the threshold range Vref=/− Voffset.

The above dual feedback control circuit provides slow stable control via a first low bandwidth and high gain feedback path when the feedback voltage is within a threshold range of the reference value Vref. When the feedback goes outside the threshold range the second feedback path of the controller turns on with effect of substantially increasing the control gain to provide a very fast correcting response. When the output voltage moves back to the threshold range the second feedback path turns off so that the controller again has a slow stable control characteristic of the first feedback path.

Figure 3:
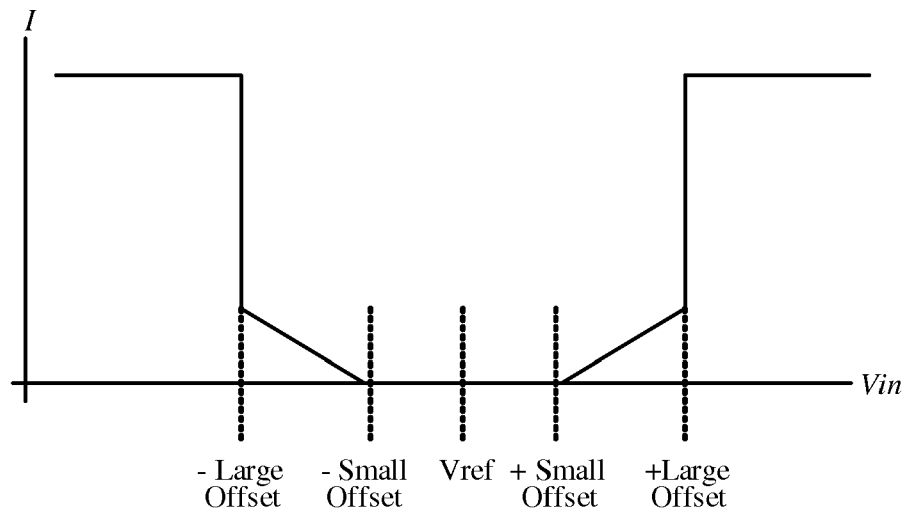
FIG. 3 is a schematic illustration of current generator outputs.

Referring the FIG. 3, the current generators of the second feedback path can also be made to have an adaptive characteristic whereby when the feedback signal Vin falls outside a first voltage threshold Vref=/− a small Voffset the sink and source currents begins to ramp up slowly until the feedback signal at Vin moves outside a larger voltage threshold Vref=/ 31 a larger Voffset when the sink or source currents turned full on to take fast corrective action.

Figure 4:
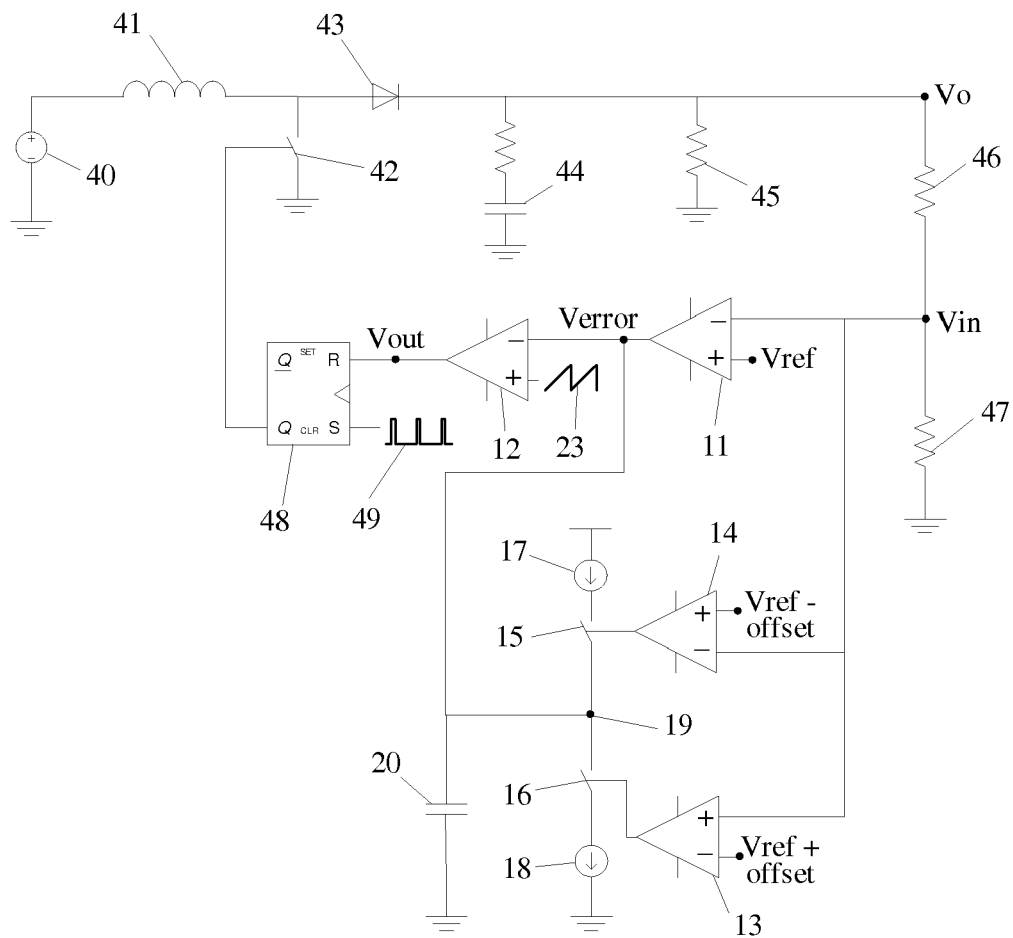
FIG. 4 is a schematic circuit diagram of a boost converter including a feedback controller according to the invention.

FIG. 4 illustrates application of the feedback controller in a switch mode power supply (SMPS). This is given by way of example only and is not intended to limit the scope of use or functionality of the invention. The SMPS circuit comprises a DC voltage source 40, an inductor 41, a switch 42, a diode 43 and a smoothing capacitor 44. This circuit will be instantly recognized by those skilled in the art as a boost-regulator and need not be described in detail. The output load of the boost-regulator is represented by resistor 45 and the feedback signal to controller input node Vin is provided by a voltage divider comprising resistors 46 and 47. The output voltage Vo of the boost-regulator is controlled by varying the duty cycle of switch 42 as is known. Switch 42 is turned on and off by a RS latch (aka a RS flip-flop) 48. The outputs of the RS latch 48 is controlled by a pulse train signal at the set input (S) and the output voltage Vout of the feedback controller coupled to the reset input (R). As it will be well understood by the skilled addressee the output Q of the RS latch 48 is set high when set input S is made high and remains high after input S goes slow. The output Q of the RS latch 48 is set low when the reset input R is made high and remains low after the input R goes low. Accordingly, the switch 42 is closed at the beginning of each cycle by a pulse of the pulse train at the set input S and it is turned off again at some point in the cycle by the output Vout of the controller going high at the reset input R of the RS latch 48. The duty cycle of the switch 42 and thus the output voltage Vo of the boost-regulator is controlled by the controller turning the switch off at different points in each cycle.

The important difference between the controller of FIG. 1 and the controller in FIG. 4 is that the ramp 23 and error signal Verror inputs to comparator 12 are transposed between the non-inverting (+) and inverting (−) inputs of the comparator 12. Thus, in the circuit of FIG. 4, when the error signal at Verror is higher than the level of the ramp the output of comparator 12 goes as low as possible and when the error signal falls below the level of the ramp 23 the output of the comparator goes as high as possible on to reset the RS latch 48 and turn off the switch 42 of the boost converter. When the level of error signal Verror increases the output of comparator 12 goes high later in each cycle which in turn increases the duty cycle of the switch 42.

When the feedback signal Vin is within the range Vref=/−Voffset the error signal Verror is small and the duty cycle of the switch 42 is within the normal operating range. If there is, for example, a sudden step load change in the boost converter output the output voltage Vo will fall and feedback signal Vin will falls below the threshold Vref−Voffset. The output of comparator 14 output goes high turning on sourcing current generator 17 which injects current into error signal Verror causing the error signal to increase quickly which in turn very quickly increases the duty cycle of switch 42 in order to return the output voltage Vo to within its normal range. If the output voltage rises too high then the feedback signal Vin increases above Vref+Voffset making the output of comparator 13 go high and turning on the sinking current 18 which reduces the error voltage Verror very quickly reducing the duty cycle of switch 42 and returning Vo to within its normal range.

The feedback controller of the invention, when used in a SMPS, has the advantage of having a first feedback path that provides slow stable regulation for stable loads combined with a second high gain feedback path that provides fast response to sudden step load changes.

Where in the above description reference has been made to integers or elements have S known equivalents there such are included herein as if explicitly set forth. Further, the invention has been described as practiced in a boost-regulator, but this is not intended to limited the scope of use of functionality of the invention and the skilled addressee with appreciate the invention can be used in other types of SMPS and also has general application in feedback control systems.

What is claimed is:

1. A feedback controller having an input node and output node, comprising:
   a first feedback circuit connected between the input node and the output node and having an error node, the first feedback circuit comprising a feedback amplifier for comparing a feedback signal to a first reference signal and providing an error signal, and a comparator for comparing the error signal to a second reference signal and providing an output signal, and
   a second feedback circuit connected between the input node and the error node, the second feedback circuit comprising a current source coupled to drive current directly to the error node and a controller coupled to the input node and the current source, the controller comparing the feedback signal to a threshold and controlling the current source to be on and drive current directly to the error node when the feedback signal has a value less than a value of the threshold, wherein the value of the threshold is lower than a value of the first reference signal.

2. The feedback controller of claim 1 wherein the feedback amplifier is a low bandwidth and high gain differential amplifier.

3. The feedback controller of claim 1 wherein the first feedback circuit is a voltage-control circuit.

4. The feedback controller of claim 1 wherein the second feedback circuit is a current-control circuit.

5. The feedback controller of claim 1 wherein the current source comprises a current sink.

6. The feedback controller of claim 1 wherein the value of the threshold comprises a lower threshold value and the threshold further comprises an upper threshold value and the current source comprises a source current and a sink current and the controller is arranged to turn on the source current if the value of the feedback signal is above the upper threshold value and to turn on the sink current if the value of the feedback signal is below the lower threshold value, wherein the upper threshold value is above the value of the first reference signal.

7. The feedback controller of claim 6 wherein the controller comprises a first comparator for comparing the value of the feedback signal to the upper threshold value and turning on and off the source current, and a second comparator for comparing the value of the feedback signal to the lower threshold value and turning on and off the sink current.

8. The feedback controller of claim 1 further comprising a switch coupled to the comparator for being turned on and off by the feedback controller.

9. The feedback controller of claim 8 wherein the switch controls the output voltage of a switch mode power supply.

10. A feedback control circuit having an input node, an error node and output node, the circuit comprising:
    a first feedback path connected between the input node and the output node, the first feedback path comprising a first comparator coupled between the input node and error node for comparing a feedback signal to a first reference and providing an error signal, and a second comparator coupled between the error node and output node for comparing the error signal to a second reference and providing an output signal, and
    a second feedback path connected between the input node and the error node, the second feedback path comprising a current source generating a source current and a current sink generating a sink current, the current source coupled to deliver the source current to the error node, the current sink coupled to deliver the sink current to the error node, and a control circuit coupled to the input node and to the current source and to the current sink for turning the source and sink currents on and off, wherein the controller is arranged to turn on the source current when a value of the feedback signal is above an upper threshold value and to turn on the sink current when the value of the feedback signal is below a lower threshold value, wherein the lower threshold value is lower than a value of the first reference and the upper threshold value is above the value of the first reference.

11. A Pulse-Width-Modulated (PWM) control circuit for a switch mode power supply having an inductor, a switch controlling current in the inductor and an output, the control circuit comprising:
- a switching circuit having an error node and controlling a duty-cycle of the switch in response to an error signal at the error node,
- a low bandwidth feedback circuit connected to the switch mode power supply output for sensing a portion of an output signal of the switch mode power supply and generating a first error signal at the error node,
- a high gain high bandwidth feedback circuit connected in parallel with the low bandwidth feedback circuit and connected to the switch mode power supply output for sensing the portion of the output signal of the switch mode power supply and generating a second error signal at the error node, wherein the high gain high bandwidth feedback circuit compares the portion of the output signal to upper and lower threshold values and generates the second error signal only when the portion of the output signal is above the upper threshold value or below the lower threshold value,
- a switched current source in the high gain high bandwidth feedback circuit, the switched current source connected to the error node and to a supply node, the switched current source supplying a source current from the supply node to the error node when the high gain high bandwidth feedback circuit determines that the portion of the output signal is above the upper threshold value or below the lower threshold value.

12. The PWM control circuit of claim 11 wherein the high gain feedback circuit further comprises a controller coupled to the switch mode power supply output for controlling the switched current source in response to the portion of the output signal being above or below the threshold values.

13. The PWM control circuit of claim 12 wherein the switched current source comprises a current sink.

14. The PWM control circuit of claim 12 wherein the controller comprises a comparator for comparing the value of the portion of the output signal to the threshold values, and a switch coupled to the comparator for turning the switch on and off in order to control the switched current source.

15. The PWM control circuit of claim 12 wherein the switched current source comprises a source current and a sink current and the controller is arranged to turn on the source current if the value of the portion of the output signal is above the upper threshold value and to turn on the sink current if the value of the portion of the output signal is below the lower threshold value.

16. The PWM control circuit of claim 15 wherein the controller comprises a first comparator for comparing the value of the portion of the output signal to the upper threshold value and turning on and off the source current, and a second comparator for comparing the value of the portion of the output signal to the lower threshold value and turning on and off the sink current.

17. The feedback controller of claim 1, wherein the controller controls the current source to ramp up its current as the amount by which the value of the feedback signal is below the value of the threshold increases.

18. The feedback control circuit of claim 10, wherein the controller controls the sink current source to ramp up its current as the amount by which the value of the feedback signal is below the lower threshold value increases.

* * * * *